United States Patent [19]

Shiloh et al.

[11] Patent Number: 4,840,204
[45] Date of Patent: Jun. 20, 1989

[54] AXIAL COMPONENT LEAD CUTTER AND FORMER

[76] Inventors: Avraham Shiloh, 127 Thunder Cir., Bensalem, Pa. 19020; Adam Shiloh, 3517 Glen Way, Huntingdon Valley, Pa. 19006; Peretz J. Shiloh, 534 A Knights Bridge, Bensalem, Pa. 19020

[21] Appl. No.: 160,145

[22] Filed: Feb. 25, 1988

[51] Int. Cl.$^4$ .............................................. B21F 45/00
[52] U.S. Cl. .................................... 140/105; 140/71 R
[58] Field of Search ................. 140/1, 71 R, 105, 106

[56] References Cited

U.S. PATENT DOCUMENTS

| | | | |
|---|---|---|---|
| 2,776,678 | 1/1957 | Savage | 140/71 R |
| 3,540,494 | 11/1970 | Susong | 140/105 |
| 4,515,001 | 5/1985 | Zahn | 140/105 |

Primary Examiner—Lowell A. Larson
Attorney, Agent, or Firm—Steele, Gould & Fried

[57] ABSTRACT

An apparatus for bending leads axially protruding from a component includes a pair of spaced apart discs mounted on a shaft. Each disc has a plurality of generally V-shaped cutouts that are axially in registry with the cutouts on the other disc such that the component is retained in a registered pair of cutouts. The span between opposing leading and lagging surfaces defining each cutout, is related to the radius of curvature of a partially conically shaped lagging outboard edge of the cutout by a predetermined function. In other words, due to the V-shape of the cutout, the head is held at a certain radial position in the cutout between the leading and lagging surfaces of the cutout. At this radially coincidental point, the span of the cutout of course equals the diameter of the lead. The radius of curvature of the lagging outboard edge of the cutout at that radially coincidental point is made a predetermined function of the diameter of the lead, for example equal thereto. The apparatus also includes a wire bending mechanism that is disposed outboard of the component on either side of the pair of discs. A cutting mechanism may also be included mechanically upstream of the lead wire forming unit.

14 Claims, 5 Drawing Sheets

AXIAL COMPONENT LEAD CUTTER AND FORMER

BACKGROUND OF THE INVENTION

The present invention relates to a wire cutter and former and especially to a cutter and former for the axially extending lead wires of electrical components. In certain applications, it is necessary to bend the leads axially extending from certain electrical components such as resistors, diodes, etc., in a predetermined fashion. These "components" can also be plain wires used as jumpers on circuit boards, the opposite axially extending ends being bent for placement in the holes of a printed circuit board in the same manner as components having a component body between the leads. The leads must be bent with precision in order to avoid stress points near the bend in the lead. Particularly in military applications, stress points in the bent leads can cause failure of the component by breakage of the lead or the body. Therefore, military specifications require that the bend in the lead has a certain radius of curvature. Specifically, certain military specifications require that the radius of curvature of the bent lead must equal or exceed the diameter of the lead itself. In other words, if the lead wire has a diameter of 0.023", the radius of curvature of the bend cannot be less than 0.023".

A lead cutter and bender of the general type of interest, for feeding and trimming component leads, is shown in U.S. Pat. No. 4,633,919—Shiloh et al. The disclosure of this patent is incorporated herein for particulars of drive shaft and article handling. In prior art devices, the axially extending leads were bent by placing the component in a die and bending the lead wire over a specially configured die surface. However, when different sized lead wires were encountered, the wire forming dies had to be changed. In an automated process, the changing of the dies significantly affects production time.

OBJECTS OF THE INVENTION

It is an object of the present invention to provide an apparatus for bending leads axially protruding from a component.

It is another object of the present invention to provide a lead bending apparatus wherein the leads extending axially from the component are retained in a pair of registered cutouts and the lagging outboard edges of the cutouts define a partially conically shaped edge with a radius of curvature that is a predetermined function of the gap across the cutout at that point, e.g., the curvature of the edge of the cutout where the lead rests when dropped into the cutout, can equal the diameter of the lead. Therefore when the lead is bent over the lagging outboard edge of the cutout, the radius of curvature of the coincidental edge at the operative point of the diameter of the lead inherently bends the lead to the required radius.

It is a further object of the present invention to provide a lead former that reduces the stress on the lead because a portion of the lead is pinched between the sides of the cutout inboard of the specially curved lagging edge.

It is a further object of the present invention to provide a lead forming apparatus wherein the cutouts are in discs and the discs are interchangeable, each disc having a different radius of curvature to wire size function.

It is an additional object of the present invention to provide a lead forming apparatus that also trims or cuts leads prior to bending.

SUMMARY OF THE INVENTION

In one embodiment, the apparatus for forming leads axially protruding from the component includes a pair of spaced apart discs mounted on a shaft. Each disc has a plurality of generally V-shaped cutouts that are axially in registry with the cutouts on the other disc such that the component is adapted to be retained by its oppositely protruding leads in a registered pair of cutouts. The span between opposing leading and lagging surfaces, that define the cutout, is a predetermined function of the radius of curvature of a partially conically shaped lagging outboard edge of the cutout. In other words, the lead is held at a certain radial position in the cutout by the leading and lagging surfaces of the cutout. At this radially coincidental point, the span of the cutout of course equals the diameter of the lead. According to the invention radius of curvature of the lagging outboard edge of the cutout at that radially coincidental point is a predetermined function of the diameter of the lead, for example equal thereto. The apparatus also includes a wire bending mechanism that is disposed outboard of the component on either side of the pair of discs.

BRIEF DESCRIPTION OF THE DRAWINGS

Further objects and advantages of the present invention can be found in the detailed description of the preferred embodiments when taken in conjunction with the accompanying drawings in which.

DETAILED DESCRIPTION OF THE PREFERRED EMBODIMENTS

The present invention relates to an apparatus for forming leads that axially protrude from a component.

Figure 1:
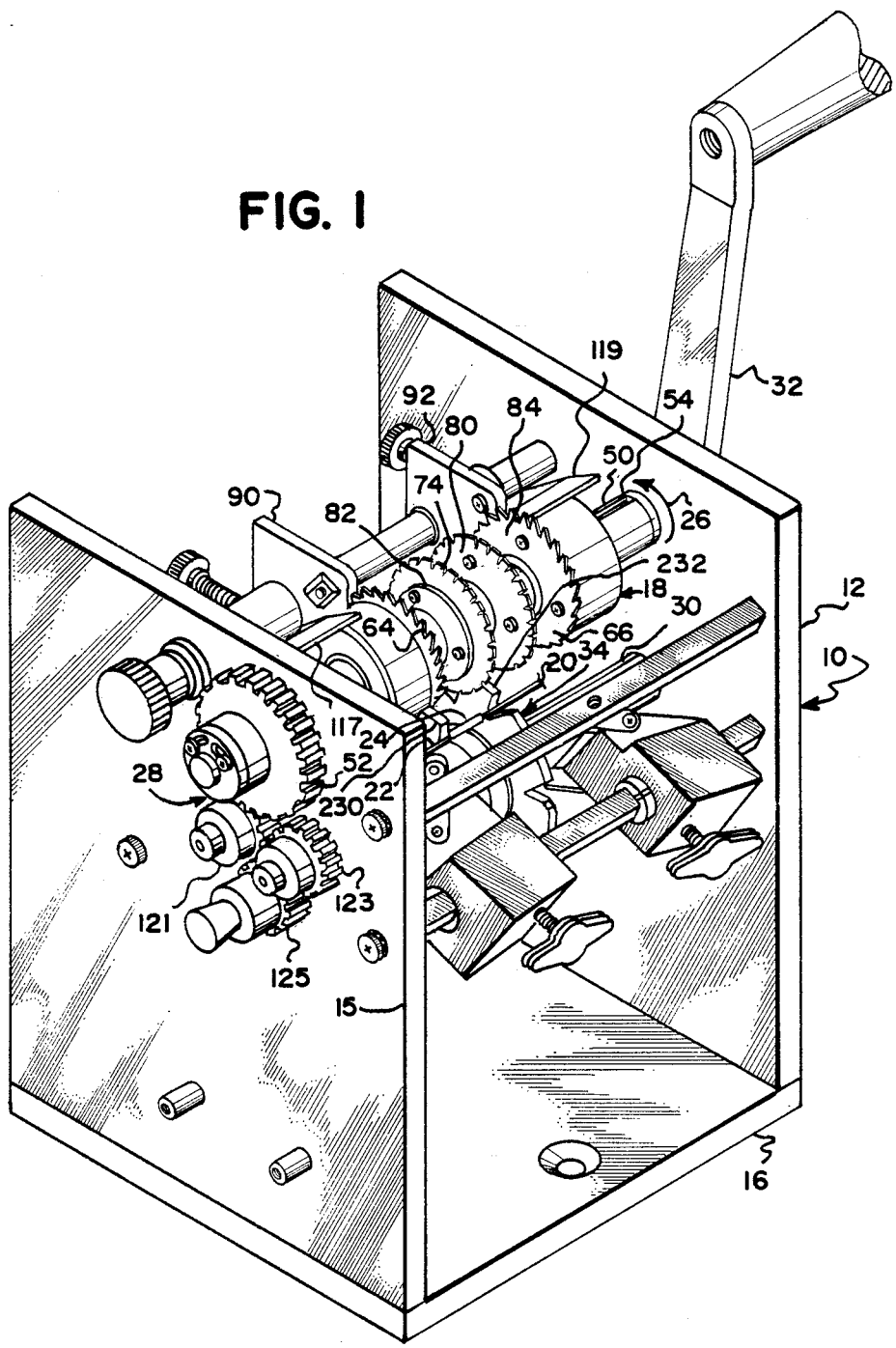
FIG. 1 illustrates a perspective view of the cutting and forming apparatus in accordance with one embodiment of the present invention.

FIG. 1 illustrates a perspective view of cutting and forming apparatus 10. Cutter and former 10 include side walls 12 and 15 mounted on base 16. The general portions of cutter and former 10 are cutting means 18 which trims the outboard ends of axially extending leads 20 and 22 extending coaxially from component 24. Cutting means 18 rotates in the direction shown by arrow 26. Cutting means 18 is driven by interlocking gear unit 28 that is coupled via a rotating shaft 30 to crank handle 32. Shaft 30 is part of lead wire forming unit 34.

Figure 2A:
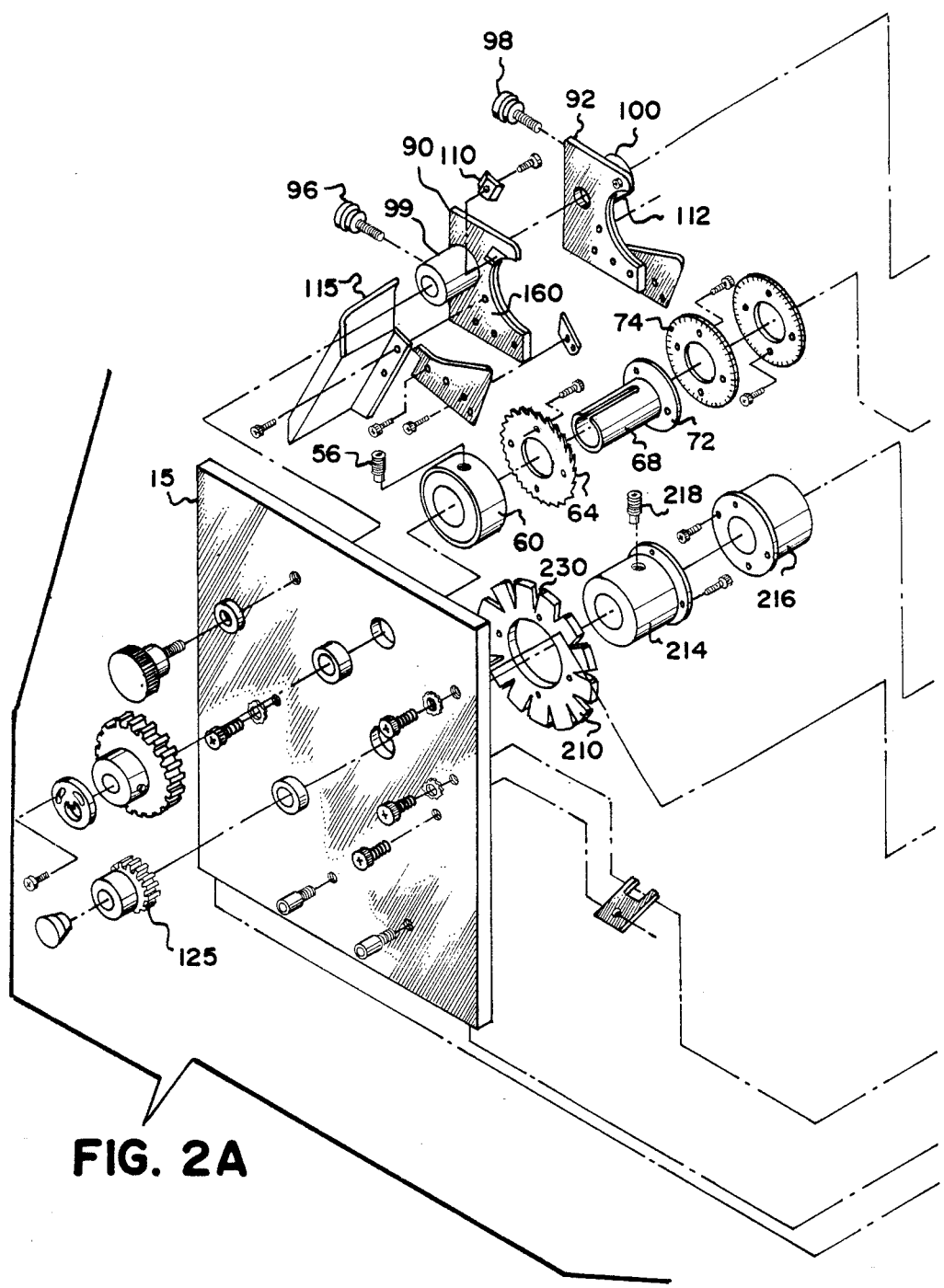
FIGS. 2A and B illustrate an exploded perspective view of the apparatus.
Figure 2B:
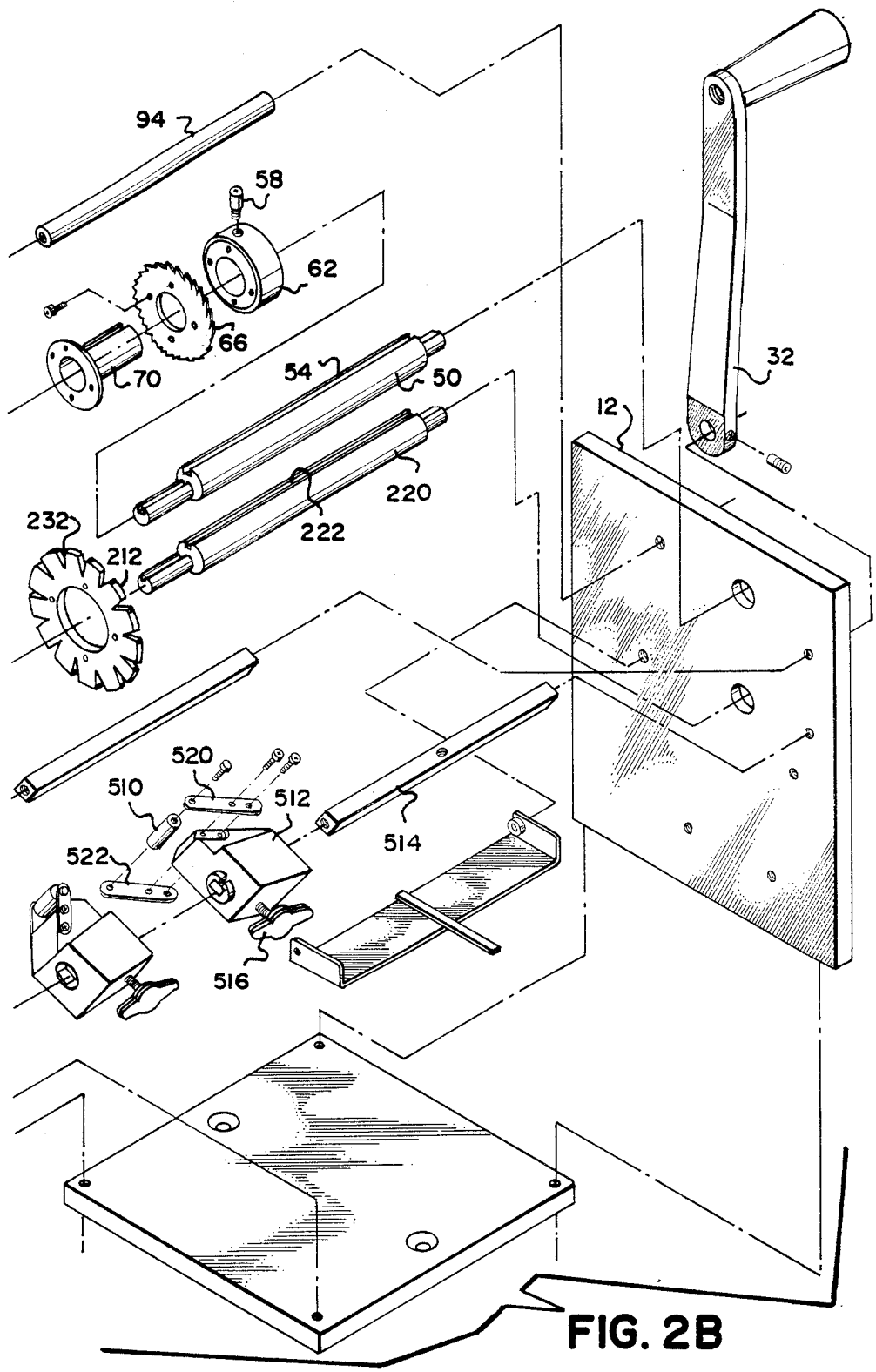

The specific components of cutting means 18 and lead wire forming unit 34 will be described in conjunction with FIGS. 1 and 2 concurrently wherein FIG. 2 shows an exploded view of the entire cutting and forming apparatus 10.

Cutting means 18 includes shaft 50 rotatably driven by drive gear 52. Shaft 50 includes slot 54 which provides a key slot for set screws 56 and 58 threaded into bushings 60 and 62. Outboard lead guide wheels 64, 66 are mounted to the inboard ends of bushings 60 and 62. As used herein, the term "inboard" refers to items closer to the electrical component as compared with other items referenced thereto. Likewise, the term "outboard" refers to items further away from the component as compared with the item referenced thereto. Therefore, apparatus walls 15 and 12 are outboard of bushings 60 and 62. Bushings 60 and 62 are mounted on sleeves 68, 70 and the sleeves are movably mounted on shaft 50. The bushing and outboard lead retaining wheel 64 are slidably disposed on sleeve 68.

Since the right hand side of cutting means 18 is substantially similar to the left hand side, only the left hand side need be described. The differences between the left and right sides will be identified.

As shown in FIG. 1, component 80 has axially extending leads 82 and 84 that are retained in the left hand outboard lead retaining disc 64 and the corresponding inboard lead retaining disc 74 and the opposing lead 84 is retained by the right hand inboard and outboard lead retaining discs.

Mounted adjacent to outboard discs 64 and 66 are cutter supports 90 and 92. The cutter supports are mounted to outer walls 12 and 15 via a support rod 94. The cutting supports are movably adjustable along the longitudinal extent of rod 94 by thumb screws 96 and 98 extending into integral sleeves 99 and 100. Attached to cutter supports 90 and 92 are cutting blades 110 and 112.

Discard shield 115 is mounted to cutter support 90 and has an upper shield section best shown in FIG. 1 as section 117 that initially guides the outboard cutoff end of lead 82 to a position beyond the mechanical components of cutting and forming apparatus 10. Cutter support 92 also includes a shield 119.

Shaft 50 is driven by gear wheel 52 and gear trains 121 and 123 ultimately from bender drive gear 125. There is a 2:1 gear reduction in the rotary movement between gear 125 and gear 52 such that cutting means 18 rotates half as fast as wire forming unit 34.

In operation, leads 82 and 84 extending in opposite direction from component 80 are retained outboard and inboard by lead retaining discs on opposite sides of the component. The leads are carried on the discs until they pass cutters 110 and 112 (shown in FIG. 2) that define a cutting plane or surface. Cutters 110 and 112 are mounted in close proximity to outboard lead retaining discs 64 and 66. The outer ends of leads 82 and 84 are trimmed as they pass the cutters and the cutout discarded ends are carried by shields 117 and 119 to appropriate locations beyond the mechanical sections of cutting and forming apparatus 10. The trimmed lead component is rotated via the discs as shown by arrow 26 until the component ultimately falls into the wire bending discs or wheels in wire forming unit 34.

The inboard and outboard lead retaining discs can be moved longitudinally on shaft 50 by appropriate adjustment of the set screws 56 and 58 to thereby adjust the distance between the bends. Cutters 110 and 112 are in close proximity and possibly even contact with the outboard sides of outboard lead retaining discs 64 and 66 to ensure a clean, close cut of the lead wires. The teeth of the outboard discs 64, 66 have one side that is substantially radial with respect to shaft 50 to ensure proper retention of the lead wires thereon. Bushings 60, 62 are fixed to sleeves 68, 70 such that upon fixation, the entire left hand or right hand unit comprising the bushing 60, outboard disc 64, sleeve 68 and inboard disc 74 slides as a unit on shaft 50.

Cutter support 90 has an outboard face 160 that is proximate the inboard side of outboard lead retaining disc 64. Since cutter 110 is mounted on the outboard face of outboard disc 64, bushing 60, outboard disc 64, sleeve 68, inboard disc 74 and cutter support 90 are adapted to travel as a unit on shafts 50 and 94, respectively. The adjustments enable the inboard disc 74 to be closely matched with the axial length of component 80. The adjustability of outboard discs 64 and 66 enables the lead length to be easily selected.

An important feature of the present invention is lead wire forming unit 34. The lead wire forming unit includes spaced apart component support walls that are, in this embodiment, lead retaining wheels or discs 210 and 212 that are mounted onto bushings 214 and 216. Bushings 214 and 216 are fixed via set screws, one of which is set screw 218 for bushing 214, onto a shaft 220 that includes a key slot 222. Shaft 220 is attached on one side to crank handle 32 and is attached on the other side to drive gear 125. Since the left and right hand sides of the wire forming unit are similar, only the left hand side will be described herein.

Disc 210 includes a plurality of substantially V-shaped cutouts, one of which is cutout 230. Cutout 230 is axially aligned and in registry with a similar cutout 232 in the other disc 212. As shown in FIG. 1, the registry between cutout 230 and cutout 232 enables the leads 22 and 20 of component 24 to be retained within the cutouts, parallel to the axis of discs 210, 212.

As best shown in FIGS. 3-7, each cutout has a leading and lagging surface defining the gap in which the component leads are received. For example, cutout 310 in FIG. 3 has a leading surface 312 and a lagging surface 314. The leading and lagging surfaces are defined based upon the rotary movement shown by arrow 316 in FIG. 3 with respect to a fixed position such as means for bending 318 that is fixed relative to walls 12 and 15 via support bar 320. In other words, surface 312 is the first surface that passes bending unit 318 and surface 314 is the second surface that passes the bending unit; therefore surface 312 is described as the leading surface and surface 314 is the lagging surface.

Each cutout has a partially conically shaped lagging outboard edge 322.

Figure 4:
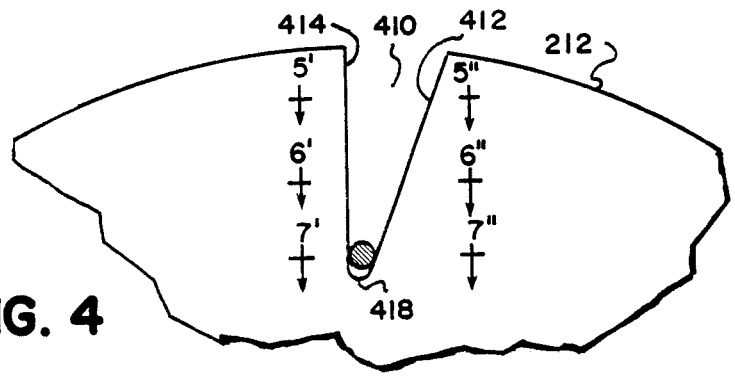
FIG. 4 diagrammatically illustrates the disc and a singular cutout.
Figure 5:
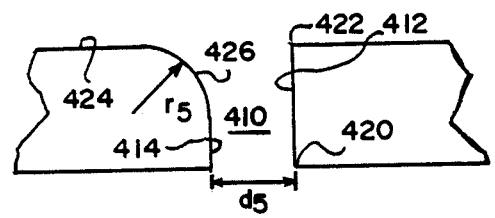
FIGS. 5, 6 and 7 respectively illustrate a broken away, cross-sectional view of the cutout in FIG. 4 as viewed from section lines 5'—5", 6'—6" and 7'—7" in FIG. 4.
Figure 6:
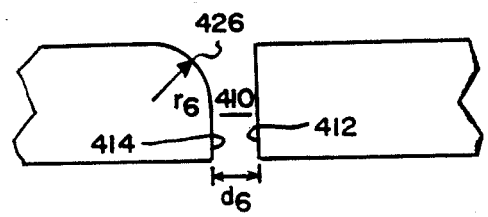
Figure 7:
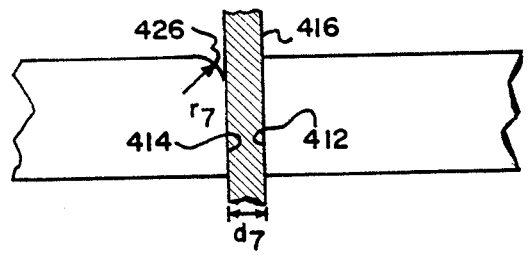

FIGS. 4-7 best show the configuration of the cutout. In FIG. 4, cutout 410 includes leading surface 412 and lagging surface 414. In one embodiment, lagging surface 414 is generally disposed on a radial line from the center of rotation of disc 212. FIG. 4 is a view from an inboard perspective (near the component) looking outboard. Axially extending lead 416 is trapped near apex 418 of cutout 410. As shown in FIG. 7, lead 416 is retained by lagging surface 414 and leading surface 412. This retention over a substantial length of the lead relieves stress during the bending operation because the lead is securely pinched between the sides of the cutout. As shown in FIG. 5, leading surface 412 includes an inboard leading edge 420 and an outboard leading edge 422. The outboard lagging edge between lagging surface 414 and outboard face 424 is continuously curved and the lagging outboard edge 426 has a radius of curvature of $r_5$. The span between leading surface 412 and lagging surface 414 is $d_5$. Therefore, at that radial position in the cutout span $d_5$ is coincidental to radius of curvature $r_5$. The coincidence is along an arc through the cutout. As shown in FIG. 6, lagging outboard edge 426 has a different radius of curvature $r_6$, as compared with $r_5$, and also the span between lagging edge 414 and leading edge 412 is different having a distance $d_6$. In FIG. 7, the span between the leading and lagging surface 412 and 414 is $d_7$ whereas the radius of curvature of lagging outboard edge 426 has a radius of curvature $r_7$.

Figure 3:
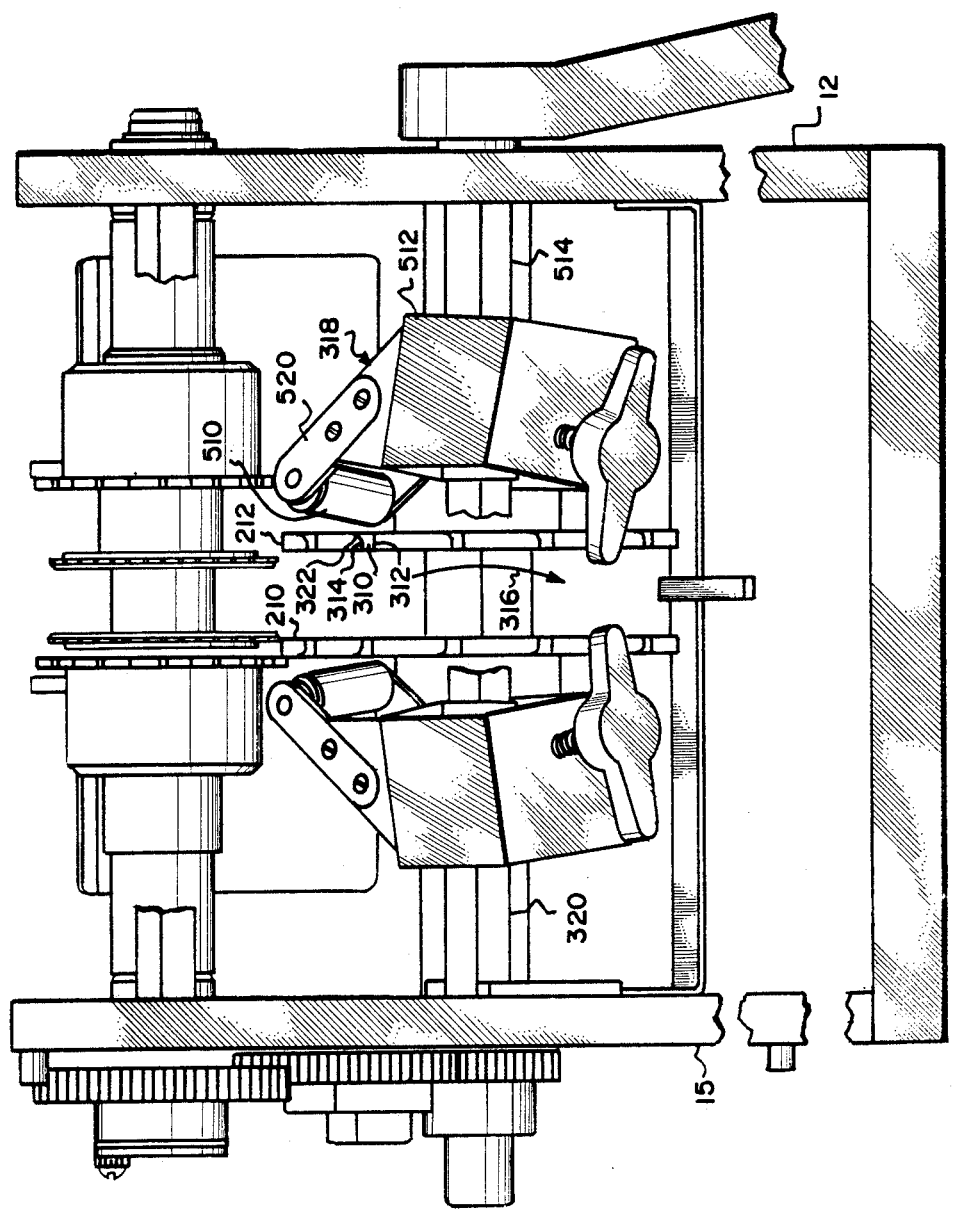
FIG. 3 illustrates a front elevational view of the apparatus.

The different radii of curvature of the lagging outboard edge define a partial, conical shape against which lead 416 is bent by the bending unit 318 shown in FIG. 3. There exists a mathematical relationship or a predetermined function between the span d and the coincidental radius of curvature r at the lagging outboard edge. According to certain military specifications, the radius of curvature of the bend of the lead wire should equal the diameter of the lead wire. In other words, if the function between the span is f, then $r=f(d)$. In military applications according to such specification the function is unity, that is, $f=1$, therefore $r=d$. The function could also involve a ratio or other relationships. For example, the wire bend radius can be from 0.1 to 5.0 times the wire diameter. As the diameter of the wire is larger, the radius of curvature of the die against which the wire lead is bent becomes larger. Since the lead wire sits firmly between leading and lagging surface 412 and 414, the radius of curvature of the lagging outboard edge 426 is altered accordingly. Since the radius of curvature changes based upon the radial distance between the center of rotation of disc 412, lagging outboard edge 426 defines a partial, conical surface.

The lead bending unit 318 shown in FIGS. 2 and 3 includes, in this embodiment, a roller 510 that is fixedly mounted onto sliding block 512. Block 512 is movable on rod 514 and can be fixed on the rod via thumb screw 516. Roller 510 rotates on mounting arms 520 and 522 that are, in turn, mounted onto block 512. Roller 510 defines one of the abutment surfaces against which the lead wire strikes during rotation of discs 210 and 212. A similar roller abutment surface is shown to the left and outboard of disc 210 that is similar in all respects to the roller abutment surface 510 and its support mechanism.

Figure 8:
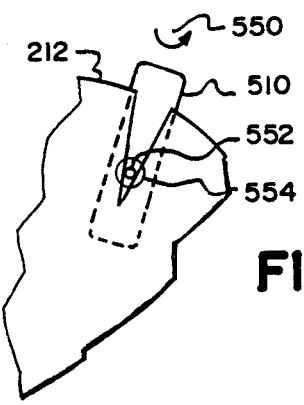
FIG. 8 diagrammatically illustrates a partial, broken away view of the disc, a single cutout, the component and the roller that bends the lead wire.

FIG. 8 shows a view of roller 510 and the roller's axis of rotation 550. The axis of rotation 550 defines a plane with the axially extending leads, one of which is lead 552 axially extending from component 554, that extends the radial length of the cutout. In other words, at one position during rotation of disc 212, when axis of rotation 550 intersects the axial center line of component 554, a plane is defined and that plane radially extends through the cutout. Additionally, the rollers are offset or canted from the vertical approximately 8 degrees. This angular offset with respect to discs 210, 212 ensures that the lead wire is not flattened during the bending process.

Just as the cutting means 18 can be adjusted to cut specific lengths off of the leads, lead forming discs 230 and 232 can be adjusted by longitudinal movement on shaft 220 to determine how far out on the lead the bend will occur. Similarly, lead bending roller block units, outboard of discs 210 and 212, can be adjusted along shaft 514.

In one working embodiment, the V-shaped groove defines an angle of 8 degrees. The discs 210 and 212 are electroplated such that the tin of the lead wires is not removed from the leads during the bending operation.

The discs 210 and 212 can be easily removed and replaced with other discs having a different radius of curvature compared with the coincidental span of the cutout. It should be noted that the wire lead forming unit 34 could be configured as a linearly rather than rotary moving device, for example as a moving belt with opposing side walls having cutouts. Pairs of opposing cutouts are in registry to retain lead wires therebetween. The lagging outboard edges of these cutouts would define partially conically shaped surfaces against which the lead wires are bent. The bending unit 318 could be any type of bar or surface against which the wire lead is urged such that the lead is bent over the lagging edge surface. Therefore, the cutout (disc or belt) need not move as long as relative movement of the cutout with respect to the bending unit is possible. Also, it is not necessary to incorporate the cutting unit 18 with the present invention since the leads may be precut prior to bending. These and other modifications and changes are meant to be covered by the appended claims.

What is claimed is:

1. An apparatus for forming leads axially protruding from a component, comprising:
   a component carrier having a pair of spaced apart component support walls, at least a pair of opposing generally V-shaped cutouts in said walls adapted to retain said component therein such that said axial leads extend outboard thereof, a lagging outboard edge of each cutout defining a partial conical surface having a conical radius of curvature that is a predetermined function of a coincidental span between opposing cutout defining surfaces; and
   means for bending the axially protruding leads of the component retained in said cutout, said means for bending disposed on either side of said pair of support walls outboard of said component.

2. The apparatus as claimed in claim 1, wherein the component carrier is arranged to support a component defined by a plain wire.

3. An apparatus for forming leads axially protruding from a component comprising:
   a pair of spaced apart wheels on a shaft, each wheel having a plurality of generally V-shaped cutouts that are axially aligned in registry such that said component is retained in a registered pair of cutouts, a lagging surface defining one side of said cutout having a continuously curved outboard edge with a radius of curvature that is a predetermined function of the radially coincident span of said cutout; and
   means for bending the axially protruding leads of the component retained in said cutout, said means for bending disposed on either side of said pair of wheels outboard with respect to said component.

4. An apparatus for forming leads axially protruding from a component comprising:
   a pair of spaced apart discs mounted on a shaft, each disc having a plurality of generally V-shaped cutouts that are axially in registry with the cutouts on the other disc such that said component is adapted to be retained in a registered pair of cutouts, a coincidental span between opposing leading and lagging surfaces defining said cutout being a predetermined function of a radius of curvature of a partially conically shaped lagging outboard edge of said cutout; and means for bending the axially protruding leads of the component retained in said cutout, said means for bending disposed on either side of said pair of discs outboard of said component.

5. The apparatus as claimed in claim 4 wherein said coincidental span is d, the coincidental radius of curvature is r and said predetermined function is between 0.1 and 5.0.

6. The apparatus as claimed in claim 4 wherein the coincidental span and radius of curvature are radially coincidental.

7. The apparatus as claimed in claim 4 wherein said leading and lagging surfaces are defined with respect to relative movement between said means for bending and said cutout.

8. The apparatus as claimed in claim 4 wherein said means for bending includes means for rotating said shaft thereby causing rotation of said discs and hence said cutouts, and said means for bending includes a pair of abutment surfaces, a respective abutment surface disposed adjacent a corresponding disc, outboard of said component retained in said registered pair of cutouts.

9. The apparatus as claimed in claim 8 wherein said abutment surface is a roller with an axis of rotation mounted with respect to the rotating shaft.

10. The apparatus as claimed in claim 9 wherein said roller is angularly offset at an angle with respect to a plane defined by said disc and the apex of said angle is near the axis of rotation of said disc.

11. The apparatus as claimed in claim 10 wherein, in at least one rotational position of said discs, when an axis of rotation of said roller intersects an axial center line of said component, when said component is retained in said registered pair of cutouts, a resulting plane radially extends through said registered pair of cutouts.

12. The apparatus as claimed in claim 4 including means for cutting opposite ends of said leads, said means for cutting disposed mechanically upstream of said discs and said means for bending.

13. The apparatus as claimed in claim 12 wherein said means for bending includes means for rotating said shaft thereby causing rotation of said discs and hence said cutouts, and said means for bending includes a pair of abutment surfaces, a respective abutment surface disposed adjacent a corresponding disc, outboard of said component retained in said registered pair of cutouts.

14. The apparatus as claimed in claim 13 wherein said means for cutting includes means for retaining said component and for moving the leads thereof through a pair of cutting planes, said means for retaining and moving coupled to said means for rotating via a gear means.

* * * * *